United States Patent [19]

Chu et al.

[11] Patent Number: 4,768,016

[45] Date of Patent: Aug. 30, 1988

[54] TIMING AND CONTROL CIRCUITRY FOR FLASH ANALOG TO DIGITAL CONVERTERS WITH DYNAMIC ENCODERS

[75] Inventors: Sow T. Chu, Nuenen, Netherlands; Kenneth W. Rohling, Burnt Hills, N.Y.

[73] Assignee: General Electric Company, Schenectady, N.Y.

[21] Appl. No.: 85,922

[22] Filed: Aug. 17, 1987

[51] Int. Cl.⁴ .............................................. H03M 1/06
[52] U.S. Cl. ....................... 340/347 AD; 340/347 DD
[58] Field of Search ................. 340/347 AD, 347 DD; 371/61, 62

[56] References Cited

PUBLICATIONS

Dingwall, Andrew G. F., "Monolithic Expandable 6 Bit 20 MHz CMOS/SOS A/D Converter", *IEEE Journal of Solid-State Circuits*, vol. SC-14, Dec. 1979, pp. 926–932.

Joy, Andrew K., "An Inherently Monotonic 7-Bit CMOS ADC for Video Applications", *IEEE Journal of Solid-State Circuits*, vol. SC-21, No. 3, Jun. 1986, pp. 436–440.

Kumamoto, Toshio et al., "An 8-bit High-Speed CMOS A/D Converter", *IEEE Journal of Solid-State Circuits*, vol. SC-211, No. 6, Dec. 1986, pp. 976–981.

*Primary Examiner*—William M. Shoop, Jr.
*Assistant Examiner*—Richard K. Blum
*Attorney, Agent, or Firm*—Lawrence D. Cutter; James C. Davis, Jr.; Marvin Snyder

[57] ABSTRACT

An analog to digital converter circuit includes encoder circuitry which employs a dummy bit line to derive timing signals employed in establishing stable, valid output digital signal information. For almost all binary codes of interest, the dummy bit line employed may actually comprise a portion of an otherwise unused bit line. The present invention is also distinguished in that it employs a clocked regenerative bit line sustainer circuit driven by dummy bit line derived timing signals. Additionally, the present invention also preferably employs a folded antiparallel architecture in which the bit lines are disposed in a generally U-shaped surrounding the parallel segments along their outer edges.

5 Claims, 4 Drawing Sheets

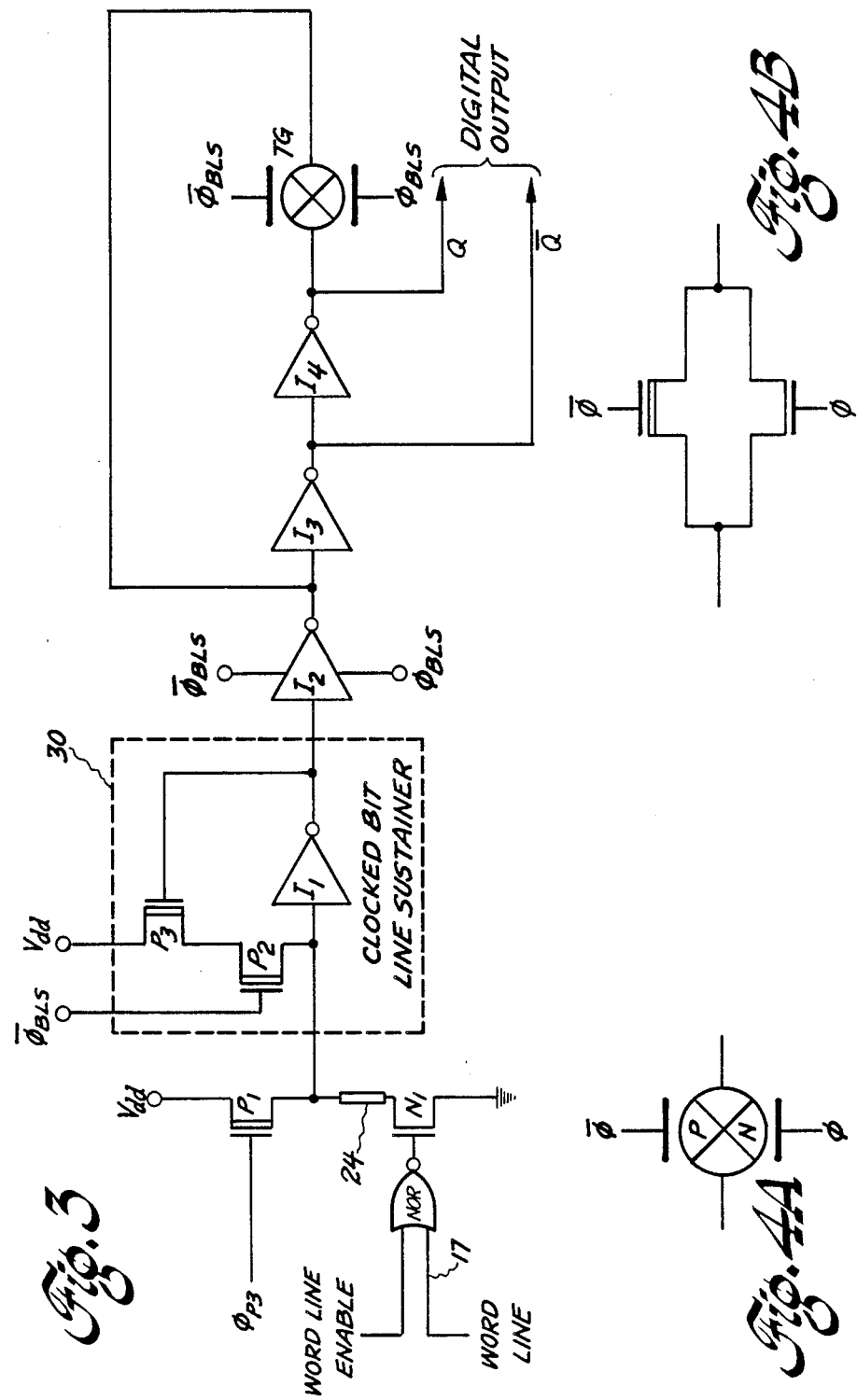

TIMING AND CONTROL CIRCUITRY FOR FLASH ANALOG TO DIGITAL CONVERTERS WITH DYNAMIC ENCODERS

The present invention is generally related to electronic circuitry for performing analog to digital (A/D) conversion. More particularly, the present invention is related to A/D converters employing high speed encoders. Even more particularly, the present invention is directed to timing circuitry for avoiding delay problems occasioned by high fan out and capacitive loading in the encoder output lines.

An analog to digital converter is an electronic circuit for receiving analog input information, typically in the form of a voltage waveform and for generating a corresponding set of binary output signals which are determined by the analog level of the voltage input. The higher the number of binary output signals generated, the more accurate the representation of the analog voltage input. For example, an analog to digital converter accepting analog inputs ranging from 0 to 10 volts and having 7 output binary signal lines (bits) is capable of resolving the analog input waveform into 128 distinct levels of approximately 0.078 volts each.

However, the main concern of the present invention is only indirectly related to the output resolution of the converter. Rather, the present invention is directed to solving speed limitation problems encountered in the encoder portion of flash analog to digital converter circuits.

In general flash analog to digital converter circuits employ some means for providing a plurality of analog reference levels. Typically, these reference levels are provided by what is commonly referred to as a "resistive ladder". A resistive ladder generally comprises a series arrangement of resistive circuit elements. Generally, the most important feature of the resistive ladder is that each of its resistive elements exhibit the same resistance. Voltage reference signals are provided, typically at each end of the ladder. Thus, the use of voltage reference signals at either end of the ladder provide a plurality of derived voltage reference levels at the nodes of the ladder (that is, between each of the resistive elements in the ladder). Each of these nodes is connected to a comparator circuit which produces a binary output signal. Each comparator is also provided with the analog input signal which is to be converted to binary form. Thus, the binary outputs of the comparator circuits can be represented by "0" or "1" signed level values. At some point along the chain of comparators associated with the resistive ladder, a transition from a 0 output to a 1 output occurs and this indicates the ladder node voltage which is closest to the analog input voltage. The comparator outputs are then typically provided to a decoder which operates to produce what is referred to as a word line signal so that, in effect, only one of the comparator output signals is seen as being active. Often the comparison and decoding functions are combined, rather than existing as separate functional blocks. Accordingly, as used herein and in the appended claims, the term "comparator means" refers to the combined comparator/decoder function.

Each of the word lines from the comparator/decoder is supplied to an encoding means which in turn drives a plurality of bit line sense circuits. However, converter speed is usually limited by the encoder circuitry because of its high fan out nature. The output signal lines from the encoder are typically long (by integrated circuit chip standards) and are connected to a number of transistors exhibiting capacitive effects. In this way, at high speed operation, which is highly desired, the encoder output lines act as highly loaded transmission lines. In order to increase the speed of the analog to digital conversion, it is necessary to minimize this bottleneck as much as possible.

Encoders employed in flash analog to digital converters are typically characterized as being either static or dynamic. Static encoders are known to be simple in design, but slow in operation. Dynamic encoders are preferable for high speed applications, particularly those of concern herein. However, they require additional circuitry to perform the necessary control and timing function. While both types of encoders have been employed in the past, the dynamic encoder has exhibited more degrees of freedom and is more flexible in the implementation of its timing and control functions.

SUMMARY OF THE INVENTION

In accordance with a preferred embodiment of the present invention, an analog to digital converter circuit includes encoder means having a dummy bit line which exhibits a bit line delay and which is used to derive timing signals to control the storage of bit output line signals in an output buffer. The use of a dummy bit line provides timing signals which exactly track bit line delay characteristics. This tracking permits the generation of valid output signals in an optimal fashion. The timing signals derived from the dummy bit line may also operate to trigger a regenerative clocked bit line sustainer which operates to "latch in" valid bit line signals as soon as they are available. The present invention also preferably arranges comparator means, decoder means and encoder means in two parallel segments on an integrated circuit chip. In this configuration, the dummy bit line is disposed in a generally U-shaped course surrounding the parallel segments around their outer course. The same is true of the other bit lines. This configuration permits the dummy bit line to exhibit electrical characteristics which are as close as possible to the delay characteristics associated with the other bit lines. Moreover, for coding schemes in which a bit line has an all ones code on one segment and an all zeros code on the other segment is possible to employ this line itself as the dummy bit line.

Accordingly, it is an object of the present invention to provide a high speed analog to digital converter circuit.

It is also an object of the present invention to provide a timing mechanism for bit line sense circuitry which operates in as rapid a fashion as possible.

It is yet another object of the present invention to improve the speed of flash analog to digital conversion devices.

It is a still further object of the present invention to provide a dummy bit line between encoder and bit line sense circuitry in flash analog to digital converters for the purpose of providing optimal timing signals to the sense circuitry.

It is also an object of the present invention to provide a method for operating analog to digital converters in which bit lines maybe pre-charged to further facilitate high speed operation.

It is also an object of the present invention to provide bit line sense circuitry with a clocked bit line sustainer.

Lastly, but not limited hereto, it is an object of the present invention to provide a folded, anti-parallel architecture for the formation of analog to digital circuits on integrated circuit chips.

DESCRIPTION OF THE FIGURES

The subject matter which is regarded as the invention is particularly pointed out and distinctly claimed in the concluding portion of the specification. The invention, however both as to organization and method of practice, together with further objects and advantages thereof, may best be understood by reference to the following description taken in connection with the accompanying drawings in which:

FIG. 3 is a schematic diagram illustrating the connection between the word lines and the bit lines and more particularly illustrating a clocked bit line sustainer circuit;

FIGS. 4A and 4B illustrate in schematic diagram form, a transmission gate such as that shown in FIG. 3;

DETAILED DESCRIPTION

Figure 1:
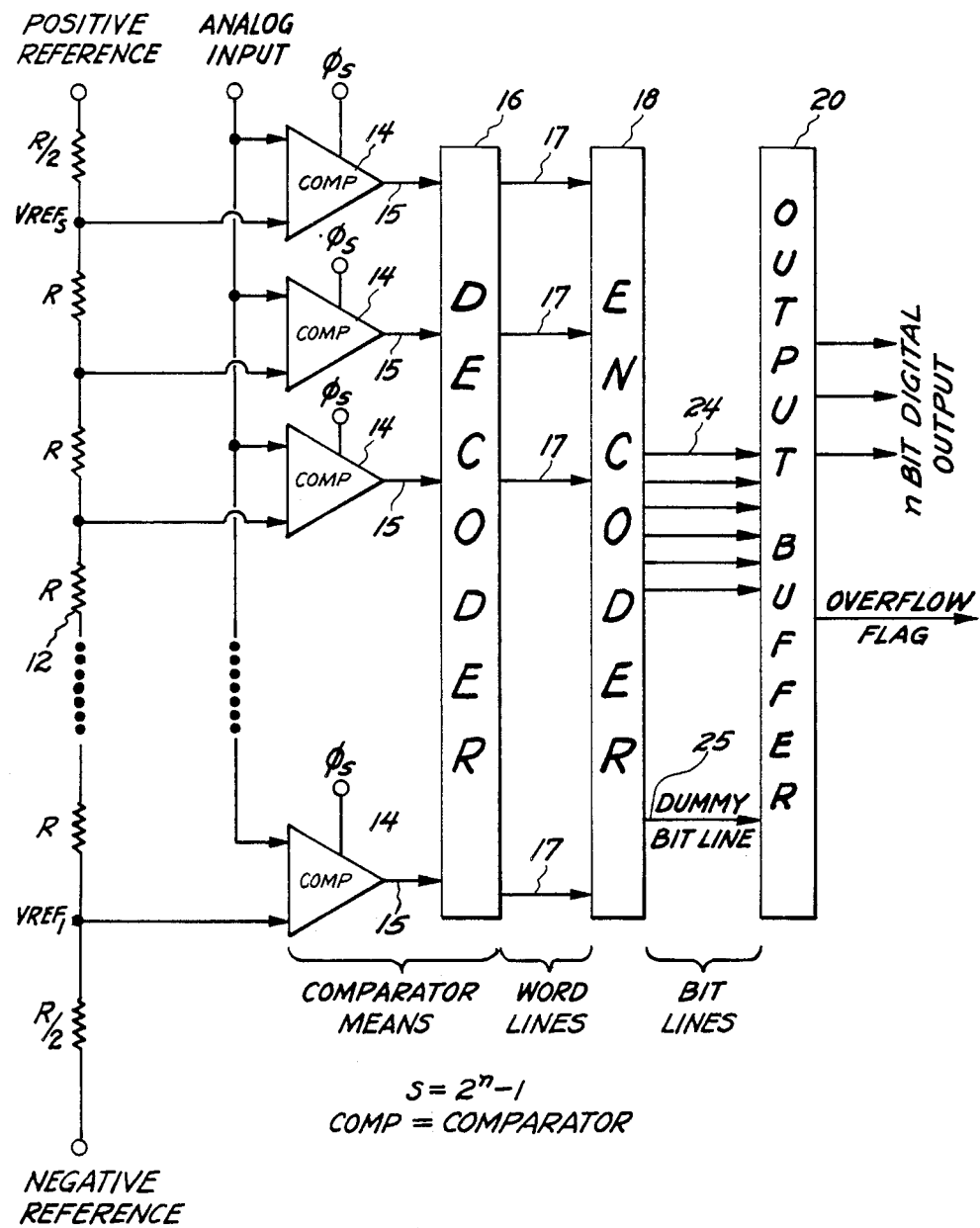
FIG. 1 is a schematic diagram illustrating the overall architecture of a flash analog to digital converter in accordance with the present invention.

FIG. 1 illustrates, in schematic diagram form, the overall construction of a flash analog to digital converter circuit. Resistive ladder 12 includes a plurality of resistive elements, each with a resistance R. Also, at each end of the ladder a resistive element with resistance R/2 is included for balance and for providing properly positioned voltage reference levels at the nodes between each of the elements in the ladder. A voltage reference level is provided at each end of the ladder. Typically, one end is provided with a positive reference level and the other end of the ladder is provided with a negative reference level. These reference level voltages are typically provided from off chip components. The reference level voltages are selected to accommodate the dynamic range of the analog input signal. Thus, the ladder shown provides s reference levels where $s = 2^n - 1$ where n is the number of bits in the digital output of the converter. The ladder thus provides voltage reference levels $VREF_1$ through $VREF_s$, as shown.

Each of the reference voltage levels $VREF_1$ through $VREF_s$ is supplied to a comparator 14 which also receives the analog signal which is to be converted to digital form. Comparators 14 also receive timing signal $\phi_s$ for synchronization with the rest of the circuitry. A more detailed depiction of timing signal $\phi_s$ is provided in FIG. 6 which is discussed more particularly below. Each comparator 14 acts to compare a given voltage reference level $VREF_i$ with the analog input signal level. It is noted that the analog input signal may in fact be provided from a sample and hold circuit. Each comparator 14 compares the level of the analog input signal with one of the voltage reference levels generated by the ladder, $VREF_i$, for example. The result of this comparison is to activate comparator output lines 15 whenever the analog input level exceeds the voltage reference level supplied to a given comparator. Thus, as shown, a contiguous set of comparator output lines 15 is activated with the other comparator lines being placed in an inactive state. Except for overflow or underflow conditions, there are two contiguous blocks of activated and inactivated comparator output lines. Generally, there will be a transition point at which the comparator output lines are entirely active or entirely inactive, depending upon whether one considers outputs as extending from the comparator associated with $VREF_s$ to the comparator associated with $VREF_1$ or vice versa.

Generally, decoder 16 operates to activate only one of its output lines, referred to as word lines. The line that is activated is the line that is associated with the transition comparator element. Thus, the output of comparators 14 and decoder 16 is a set of $2^n$ signal output lines. Only one of these lines is generally active at any given time. The activation of one of the word lines provides an indication that the analog input voltage level corresponds to a particular $VREF_i$. Often the decoding and comparison function are combined in a single functional circuit. As indicated above, this situation is considered herein and accordingly, the phrase "comparator means" is meant to refer to this dual functionality. This is also illustrated in FIG. 1.

Each of the output word lines is supplied to a separate encoder circuit, referred to collectively as encoder 18 in FIG. 1. It is the structure, function and operation of the encoder circuitry together with output circuitry which is of principal concern in the present invention. Encoder 18 functions to activate a plurality of bit lines in response to the activation of a particular word line. The encoder output lines are referred to as bit lines. It is the nature of these bit lines which often limits high speed analog to digital conversion devices. In particular, these lines are relatively long, at least at the level of an integrated circuit chip. Each of the bit lines is attached to a plurality of transistor devices, all of which exhibit a certain drain capacitance. At high speed operation (typically greater than, say 10 Mhz), the length of the line and its capacitive loading act to slow down the output circuitry. In this respect, the output bit lines can perhaps better be appreciated by considering them as transmission lines. In the present invention, one of the bit lines, or at least a portion of one of the bit lines is employed as a "dummy bit line" 25 to provide desired timing information. The bit lines, typically n in number, are supplied to output buffer 20 which latches up the desired output signal at an appropriate time to thereby provide valid output signal information.

In the description herein, it has been and will be generally assumed that the encoder function operates to produce a binary signal which represents the analog level of the input signal. It is generally assumed that the binary output signal exhibits low and high order bit positions and in general, represents an n digit binary integer with an output of 1 1 1 ... 1 corresponding to $VREF_s$ and an output of 0 0 0 ... 0 corresponding to an analog input level of $VREF_1$. It is, however, noted that encoder 18 may function to generate any number of a plurality of binary codes without departing from the practice of the present invention. However, in accordance with one embodiment of the present invention, it is noted that encoder 18 should (in that embodiment) operate to produce a code in which there is at least one bit position in which an output of 1 occurs half of the time and an output of 0 occurs for the other half of the possible output sequences.

Figure 2:
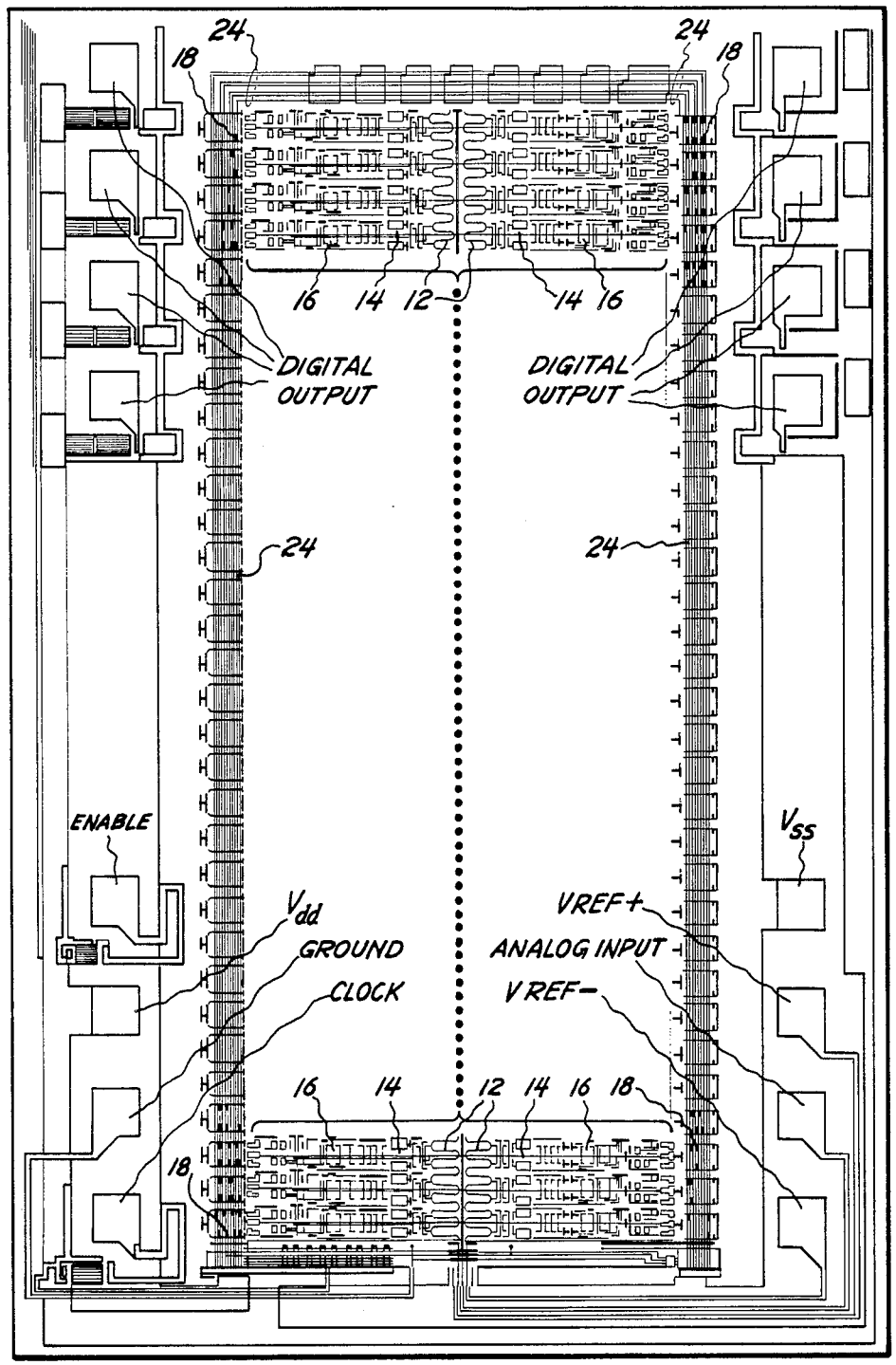
FIG. 2 is a schematic planar view illustrating the folded chip architecture layout of an integrated circuit chip implementing the dummy bit line features of the present invention.

One of the embodiments of the present invention relates to a particularly advantageous physical layout architecture for an integrated circuit chip. This layout is illustrated in FIG. 2. In particular, the configuration that is implemented is one in which the array of comparators and encoders are arranged in a folded architecture about a central vertical line of symmetry. This is in distinction to chip architectures for analog to digital conversion circuitry in which the comparator array is arranged in a linear fashion. It will be seen below that this architecture provides balance and advantages for the present system. In this architecture, resistive ladder 12 is seen as disposed in a central vertical location. The ladder is folded in half with the central node being disposed at the top of the illustration. In particular, it is seen that the ladder is provided with positive and negative voltage reference signals from the pads disposed in the lower righthand corner of the illustration. It is seen that an array of comparators and decoders and encoders extend from the lower lefthand portion of the illustration upwards to the upper lefthand portion and continuing in sequence again beginning at the upper righthand portion of the illustration and extending downwards toward the lower righthand portion of the illustration. It is the array of comparators, decoders and encoders which comprise most of the chip circuitry. Voltage supply pads, a ground pad, a clock pad and an enable pad are also shown. Along the top edge of the illustration, seven bit line sense circuits are shown. To the right of the bit line sense circuits, a dummy bit line sense circuit is shown. The pads on the left and right sides of the upper portion of the illustration are in fact the output pads of the device. One of these pads also operates as the overflow signal output pad. Of particular importance in the present invention, bit lines 24 are seen extending in a generally U-shaped configuration along the periphery of the folded comparator/encoder array arrangement. It is noted that FIG. 2 is suggestive only of gross chip features. It is, of course, not possible to illustrate details of individual circuits which are otherwise standard.

FIG. 3 illustrates a bit line output circuit together with one word line circuit. In general, the encoder of an n bit flash analog to digital converter functions similar to a memory array. It has 2n input word lines and n output bit lines. During normal operation, exactly one word line is enabled which activates the transistor representing the bit code of that particular word or row. The code can be arbitrary and is not relevant to this discussion. This point has already been considered above. The output code is produced by the action of the selected transistors on the respective bit lines.

FIG. 3 shows a circuit in accordance with the present invention where the presence or absence of an n-channel pulldown transistor $N_1$ is used for coding. Pullup transistor $P_1$ is used for bit line precharging. In the present invention, it is preferable that the bit lines are precharged to a "high" or active state. During the active period, an activated pulldown transistor such as $N_1$, discharges the line to a low state; however, the absence of a pulldown transistor $N_1$ allows the bit line to remain high. During the precharge period, wordline 17 is disabled through a wordline enable signal and a NOR gate as shown, to prevent contention between n-channel pulldown transistor $N_1$ and p-channel pullup transistor $P_1$ which is connected to supply $V_{dd}$ as shown. The bit line output is detected by means of bit line sense circuit 30 more particularly described below. This circuit is preferably disabled during the precharge period to prevent reading of invalid data. It is noted that bit line 24 is illustrated in FIG. 3 using special symbology to suggest its transmission line characteristics. The length of the bit lines and their characteristic loading is more readily appreciated from FIG. 2.

Figure 5:
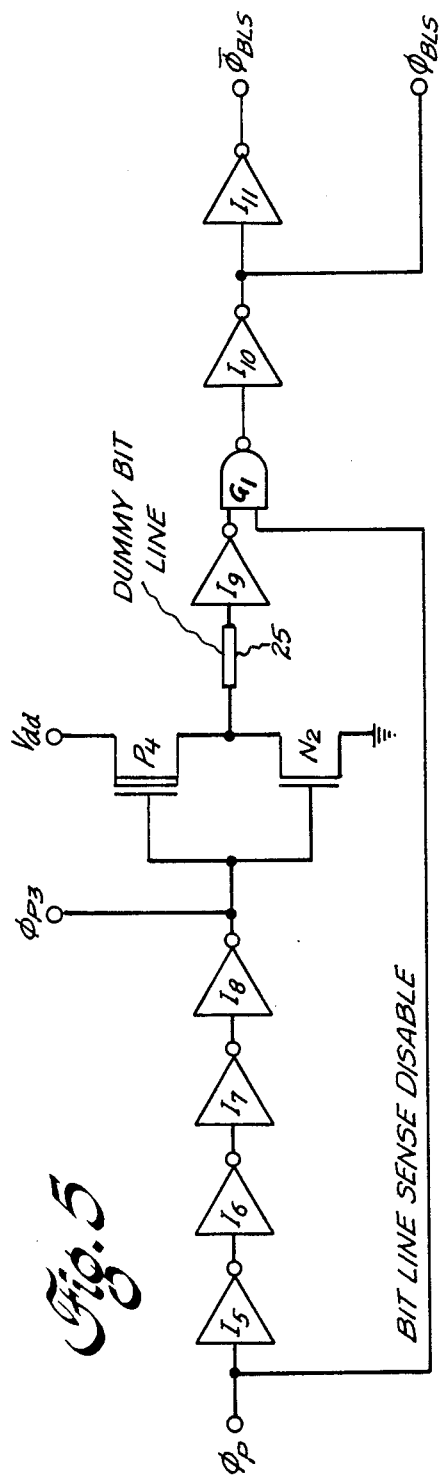
FIG. 5 is a schematic diagram illustrating the arrangement and clock signals associated with the dummy bit line.

A particularly important aspect of the present invention is the use of one or more dummy bit lines to derive timing signals for bit line sense circuits. In the precharge period, dummy bit line 25 (see FIG. 5) is charged "high" together with the data bit lines. In the active period, dummy bit line 25 is discharged by means of dummy pulldown transistor $N_2$, more particularly illustrated in FIG. 5. Dummy bit line 25 is discharged at the same rate as data bit line 24 is discharged. This is significant. The dummy bit line simulates exactly the bit line delay and produces a "bit line valid" signal and bit line sense clock signal which latch the bit line state as soon as valid data is present. This avoids the use of inexact timing circuits which results in either a slower read access time or glitches in the output. It is noted that timing signals $\phi$ bearing a p subscript generally refer to the timing of the precharge portion of the operation of the present invention. Timing signal $\phi_{p3}$ is a timing signal derived from a portion of the dummy bit line timing generation circuitry as shown in FIG. 5. Additionally, it is noted that timing signal Ⓡ$_{BLS}$ corresponds to a second portion of the operation of the present invention during which the bit lines are sensed and read out.

A second significant aspect of the present invention concerns clocked bit line sustainer circuit 30, shown in FIG. 3. Clocked bit line sustainer 30 is formed by p-channel transistors $P_2$ and $P_3$ and inverter $I_1$, as shown. In other dynamic encoder, bit lines are either held low by a selected pulldown or are left floating high. In the case of floating bit lines, charge can easily leak away causing erroneous data to be read at. In the present invention, properly timed bit line sense signals are used to close a regenerative feedback loop to restore any signal loss and to hold the data indefinitely. In the absence of clocked transistor $P_2$, contention between encoder pulldown transistor $N_1$ and transistor $P_3$ causes slower bit line response and results in higher power dissipation. On the other hand, the exclusion of transistor $P_3$ does not affect the speed of response, but causes additional power consumption.

A third significant aspect of the present invention is the manner in which the integrated circuit chip is laid out. A folded architecture is provided where the array of comparators, decoders and encoders is laid out in two anti-parallel segments. This is to be contrasted with conventional layouts in which the structures are arranged in a single straight or linear segment. In this configuration, it is preferred that the code generated by the encoder circuitry is one in which at least one bit line has an all ones code on one segment and an all zeros code on the other segment. This requirement is met by virtually all standard binary codes. Since a 1 is encoded by the absence of a pulldown, the bit line segment that has an all ones code is essentially unused and can therefore be detached from the other half of the bit line and instead used for making the dummy bit line. This is preferred in the present invention. This line is attached to the same number of coding transistors and the bit lines and the capacitor gates are grounded. This ensures that dummy bit line capacitance, which is dominated by the drain capacitance of the encoding transistors, matches and tracks the electrical characteristics of regular bit lines. This ensures proper and rapid operation of the bit line sense circuitry. With the coding scheme being as indicated, it is noted that only half of a bit line structure need by employed for the dummy bit line. Thus, with particular coding schemes, the dummy bit line aspects of the present invention are readily implemented with virtually no additional circuit requirements.

It is also noted in FIG. 3 that an output buffer is easily constructed from inverters $I_2$, $I_3$, $I_4$ and a transmission gate $T_G$, as shown, so as to provide both true and complement forms of a bit line output, namely Q and $\overline{Q}$. For completeness, transmission gate $T_g$ is more particularly shown in FIGS. 4A and 4B. It is seen that it is readily constructed from a pair of p-channel and n-channel transistor devices. The generation of $\phi_{BLS}$ and $\overline{\phi}_{BLS}$ timing signals is also more particularly shown in FIG. 5. It is particularly noted that these signals arise from dummy bit line 25. This circuitry employs inverters $I_9$, $I_{10}$ and $I_{11}$ together with AND gate $G_1$ as shown.

Figure 6:
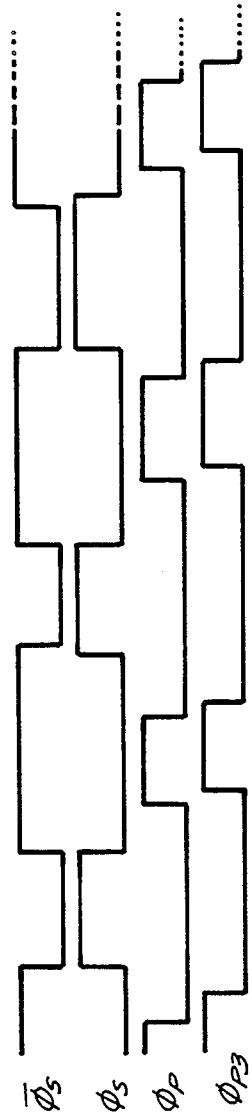
FIG. 6 is a graph illustrating various timing signals employed in the present invention.

FIG. 6 provides a set of four plots of signals, as a function of time (horizontal axis). In particular, the relative timing of precharging $\phi_p$ and timing signal $\phi_s$ is shown. It is noted that timing signal $\phi_s$ is supplied to comparators 14, as shown in FIG. 1. It is noted that timing signal $\phi_{p3}$ is identical to timing signal $\phi_p$ except slightly delayed.

From the above, it should be appreciated that all of the aforementioned objects have been achieved by the circuitry described herein. In particular, it is seen that there is provided a dummy bit line whose electrical characteristics match the characteristics of the other bit lines present so as to thereby enable the generation of timing signals which eliminate glitches and improve the read access time. Furthermore, it is seen that the present invention provides a folded architecture providing bit line symmetry and balance. It is also seen that the circuitry of the present invention is usable with any binary code and that the system is particularly useful for codes in which a single bit position may be encoded, half with ones and half with zeros across all code words. It is also seen that the present invention provides a clocked regenerative bit line sustainer driven at least in part by timing signals from the dummy bit line so as to stabilize valid bit line signals as soon as possible. It is also seen that the present invention provides precharging of the bit lines to further enhance device speed.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An analog to digital converter circuit for receiving an analog input signal and for generating a plurality of digital signals representing a binary coded form of said analog signal, said converter circuit comprising:

means for providing a plurality of analog reference levels;

comparator means for comparing said analog input signal with said analog reference levels so as to generate a unique signal on at least one line of a set of word output lines from said comparator means;

encoder means for receiving signals from said word output lines from said comparator means and for generating a plurality of digital signals on bit output lines, said digital signals representing a binary coded form of said analog input signal; and output buffer means for storing signals occurring on said bit output lines;

said encoder means including a dummy bit line which exhibits a bit line delay which is used to derive timing signals to control storage of said bit output line signals in said output buffer.

2. The converter of claim 1 in which said output buffer means includes a regenerative, clocked bit line sustainer operating in response to said dummy bit line derived timing signals.

3. The converter of claim 1 in which said comparator means, said decoder means and said encoder means are arranged in two parallel segments.

4. The converter of claim 3 in which said dummy bit line is disposed in a generally U-shaped path surrounding said parallel segments along the outer edges thereof.

5. The converter of claim 3 in which said dummy bit line is a portion of a bit line for which the output is always 0 in one of said parallel segments and always 1 in the other of said parallel segments.

* * * * *